(12) United States Patent
Alrod et al.

(10) Patent No.: US 9,431,125 B2
(45) Date of Patent: Aug. 30, 2016

(54) METHOD AND SYSTEM FOR ADAPTIVE SETTING OF VERIFY LEVELS IN FLASH MEMORY

(71) Applicants: Idan Alrod, Herzliya (IL); Eran Sharon, Rishon Lezion (IL); Noam Presman, Givatayim (IL); Ilya Bekkerman, Beer Sheva (IL)

(72) Inventors: Idan Alrod, Herzliya (IL); Eran Sharon, Rishon Lezion (IL); Noam Presman, Givatayim (IL); Ilya Bekkerman, Beer Sheva (IL)

(73) Assignee: SanDisk Technologies LLC, Plano, TX (US)

( * ) Notice: Subject to any disclaimer, the term of this patent is extended or adjusted under 35 U.S.C. 154(b) by 386 days.

(21) Appl. No.: 13/838,826

(22) Filed: Mar. 15, 2013

(65) Prior Publication Data

US 2014/0281820 A1    Sep. 18, 2014

(51) Int. Cl.
| | |
|---|---|
| G11C 29/00 | (2006.01) |
| G11C 16/34 | (2006.01) |
| G11C 11/56 | (2006.01) |
| G11C 16/10 | (2006.01) |
| G06F 11/10 | (2006.01) |

(52) U.S. Cl.
CPC ....... G11C 16/3459 (2013.01); G06F 11/1072 (2013.01); G11C 11/5642 (2013.01); G11C 16/10 (2013.01)

(58) Field of Classification Search
CPC ........... G06F 11/1068; G06F 11/1072; G06F 11/1008; G06F 11/1076; G06F 12/02; G11C 29/00; G11C 11/5642; G11C 16/10; G11C 16/3459; G11C 16/04; H03M 13/00; H03M 13/05
See application file for complete search history.

(56) References Cited

U.S. PATENT DOCUMENTS

| | | | |
|---|---|---|---|
| 5,537,358 A | 7/1996 | Fong | |
| 7,656,710 B1 | 2/2010 | Wong | |
| 8,099,652 B1 * | 1/2012 | Alrod | G06F 11/1072 714/763 |
| 2005/0213393 A1 * | 9/2005 | Lasser | 365/185.33 |
| 2006/0101193 A1 * | 5/2006 | Murin | 711/103 |
| 2006/0291290 A1 | 12/2006 | Kim et al. | |
| 2008/0056035 A1 | 3/2008 | Nazarian | |
| 2008/0192544 A1 * | 8/2008 | Berman | G11C 11/5621 365/185.09 |
| 2009/0091990 A1 | 4/2009 | Park et al. | |
| 2011/0246842 A1 | 10/2011 | Haratsch et al. | |
| 2011/0255336 A1 * | 10/2011 | Futatsuyama | G11C 11/5628 336/185.03 |
| 2012/0163085 A1 * | 6/2012 | Alrod | G06F 11/1072 365/185.18 |
| 2012/0166913 A1 * | 6/2012 | Alrod | G06F 11/1072 714/773 |
| 2012/0239858 A1 * | 9/2012 | Melik-Martirosian | 711/103 |
| 2014/0173172 A1 * | 6/2014 | Yang et al. | 711/102 |

* cited by examiner

*Primary Examiner* — Albert Decady
*Assistant Examiner* — Enamul M Kabir
(74) *Attorney, Agent, or Firm* — Brinks Gilson & Lione

(57) ABSTRACT

A system and method for computing MLC flash memory cell programming parameters to dynamically adjust verify voltage levels is provided. The method may use an iterative guess and check process that will result in a distribution of states, specifically a cell voltage distribution (CVD) that minimizes the cell error rate in cells encoded in interleaved error correction code (ECC) mode, and that balances the bit error rate between pages in cells encoded in non-interleaved ECC mode.

13 Claims, 10 Drawing Sheets

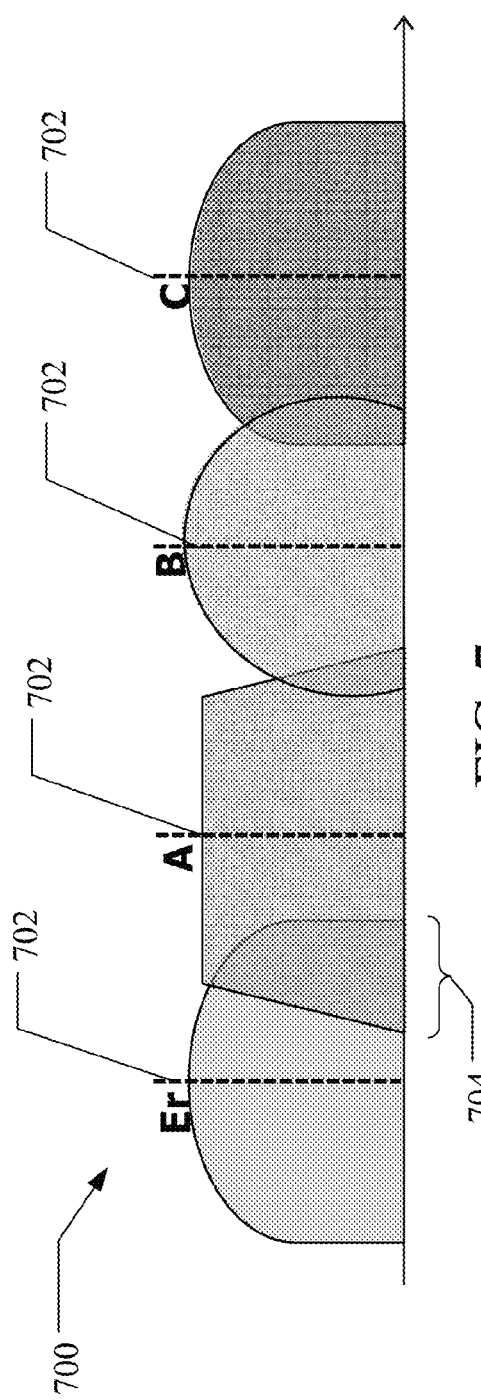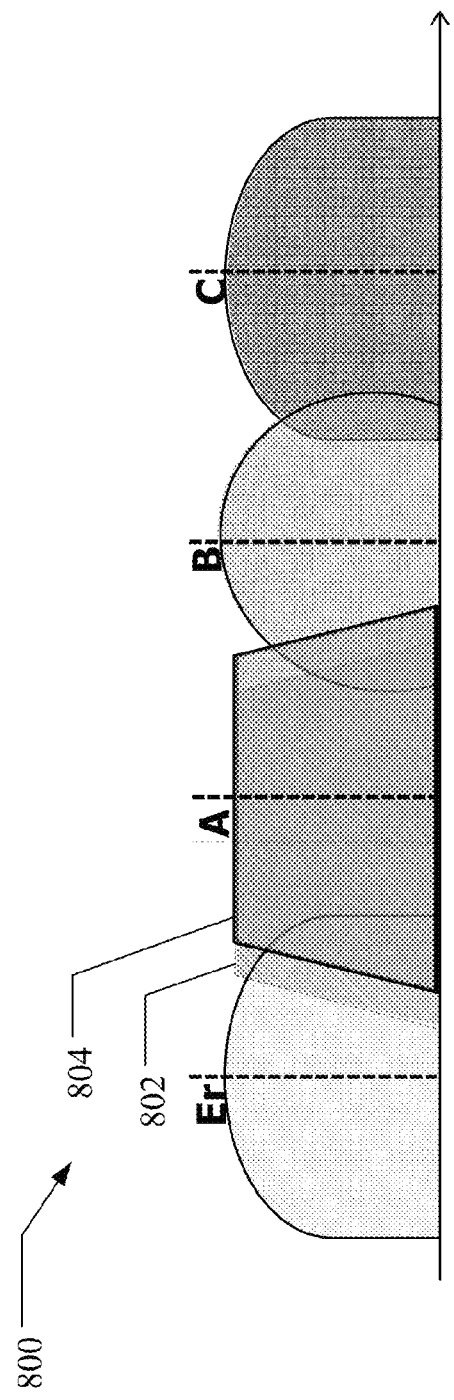
FIG. 7
FIG. 8

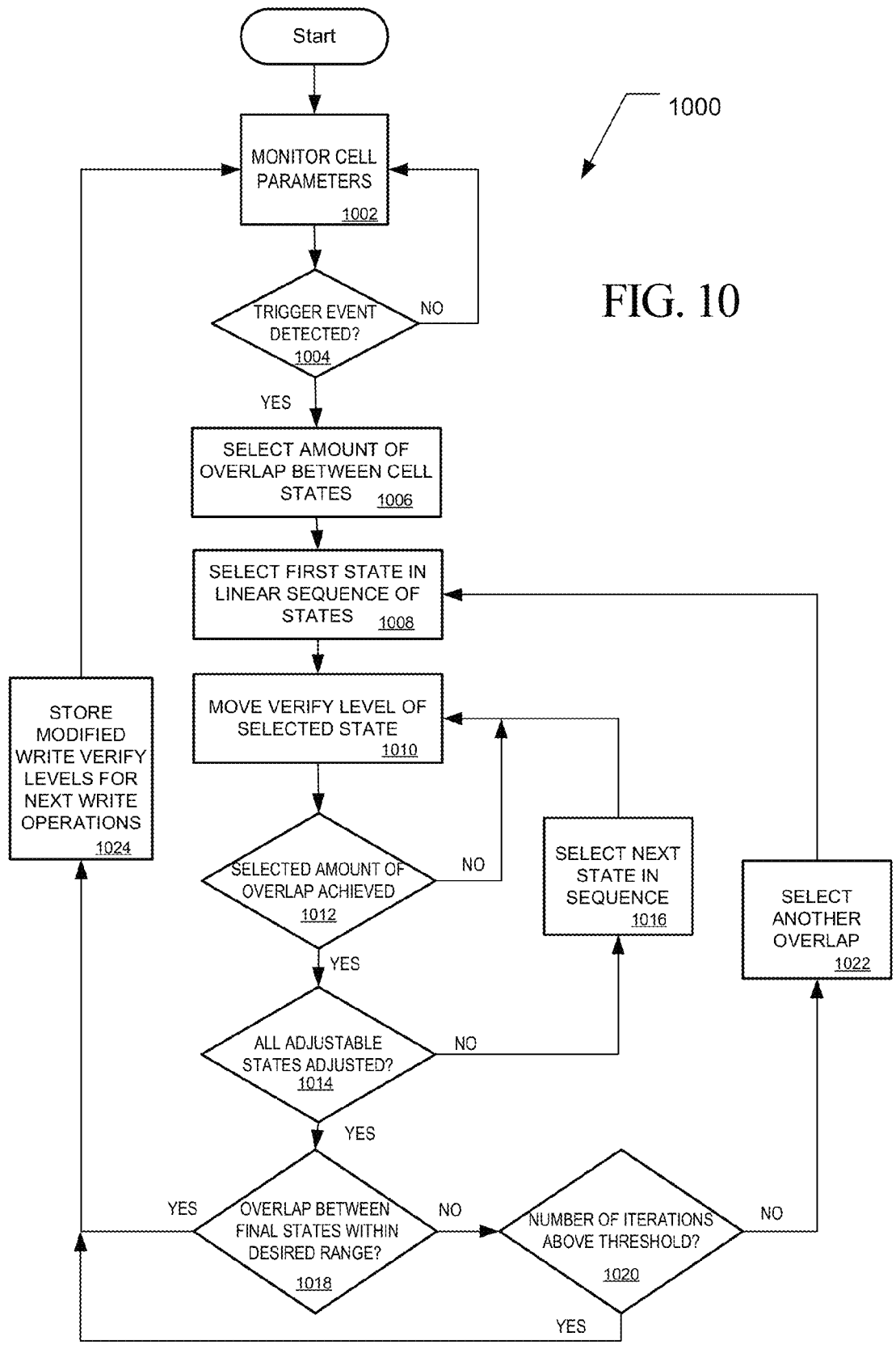

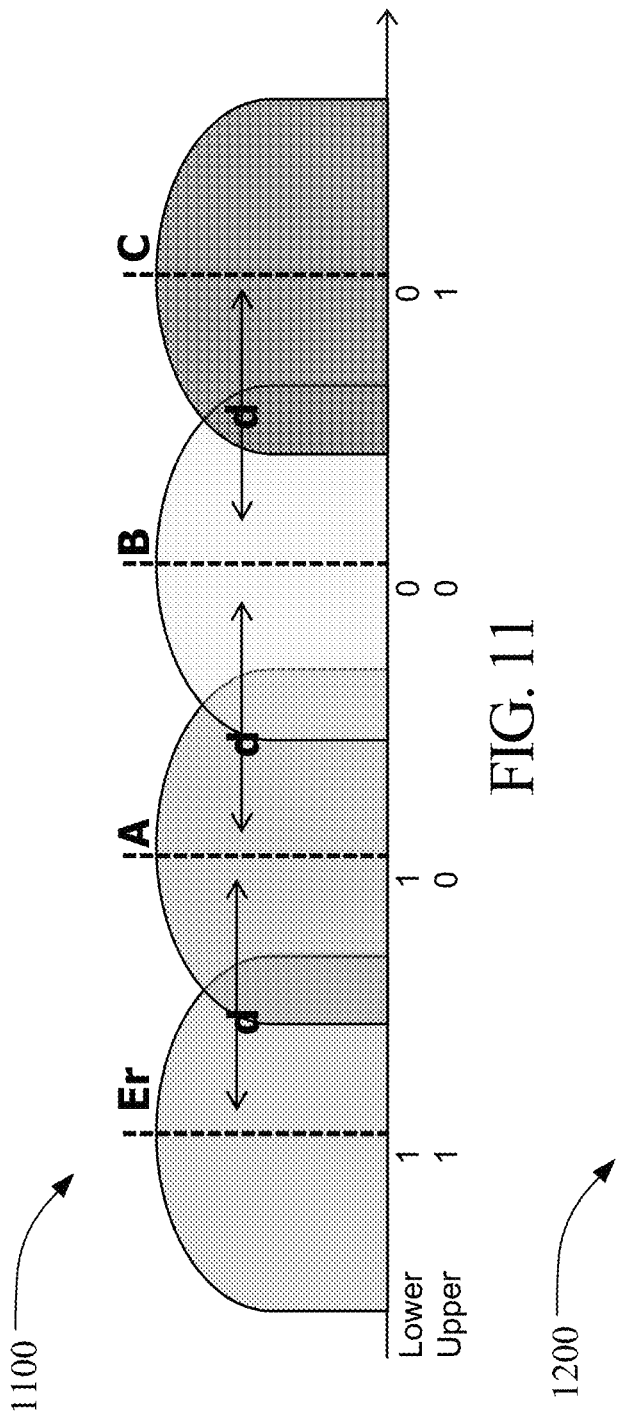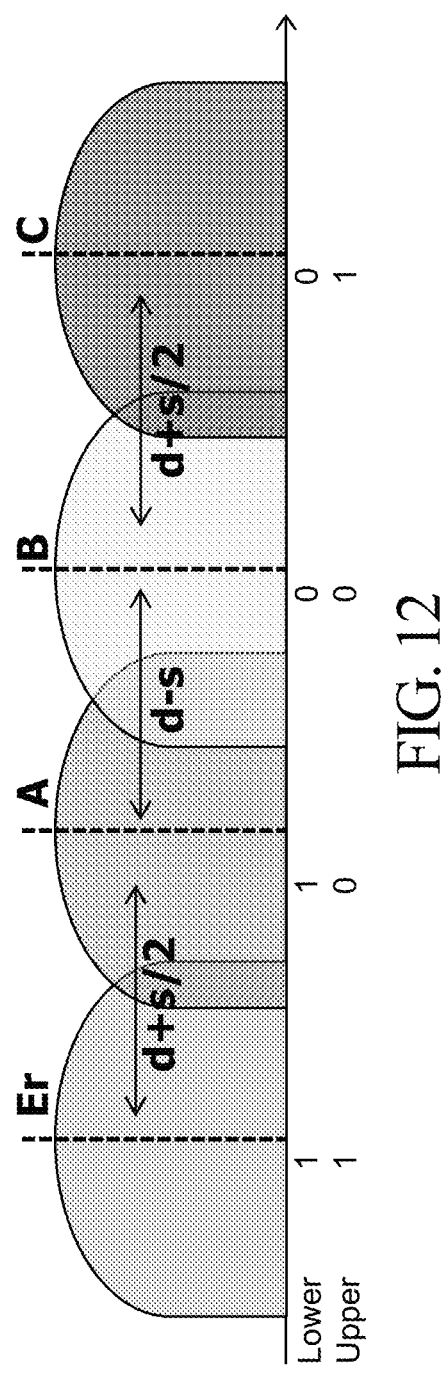

METHOD AND SYSTEM FOR ADAPTIVE SETTING OF VERIFY LEVELS IN FLASH MEMORY

BACKGROUND

Non-volatile memory systems, such as flash memory, have been widely adopted for use in consumer products. Flash memory is used in numerous applications including mobile phones, digital cameras, MP3 players and many other applications. Flash memory may be found in different forms, for example in the form of a portable memory card that can be carried between host devices or as a solid state disk (SSD). In order to be cost efficient, it is desirable to implement SSD memories using high density Multi-Level Cell (MLC) flash memories rather than Single-Level Cell (SLC) flash memory which has 1-bit per cell storage capacity. Using MLC technology, the memory capacity can be increased by a factor of 3 (for MLC storing 3 bits in each cell) or even by a factor of 4 (for memories storing 4 bits in each cell) as compared to SLC flash without increasing the physical dimensions of the memory. What increases in MLC flash is the amount of data stored in each memory cell and in each physical page (Word Line (WL)) of the memory.

Both the physical properties of MLC memory cells and the manner in which data is stored and read from MLC memory cells can lead to errors when data is read from the different pages of an MLC memory cell. Although there may be instances where an error is due to a state in a flash memory actually flips to another state, the more common type of error occurs when an adjacent state in a flash memory cell is read. Within a particular MLC cell the likelihood of a read error may differ from page to page. Sophisticated and modern error correction codes (ECC) are typically implemented in order to guarantee that the data can be read from flash memory without errors. The stronger the ECC, the more likely that errors can be corrected, however the stronger error correcting codes typically require greater processing power. Flash memories may try to apply different strength ECC codes to different pages of a MLC cell based on a different known likelihood of errors in particular pages of a cell, but this still requires greater overhead and processing delay in reading information from those cells. Also, the parameters used for most effectively addressing errors in flash memory may differ depending on whether the flash memory cells have been programmed in an interleaved or non-interleaved error correction code (ECC) mode. The problem of different BER on different pages in a non-interleaved flash memory system is typically addressed by several methods. One approach is to use different ECC codes for the different pages. This approach involves adding significant complexity for achieving a higher capacity. Other approaches may use the same ECC code for each page but store additional joint parity bits such that low BER pages can help in the decoding of high BER pages, but this sacrifices capacity for simplicity.

SUMMARY

In order to address the issues noted above, a method and system for adaptively adjusting verify levels is disclosed.

According to a one aspect, a method for adaptively setting write verify levels in a flash memory device in includes, in a controller of a flash memory device, determining if a verify level trigger event has occurred. Responsive to determining that the verify level trigger event has occurred, a cell voltage distribution (CVD) is determined for each of a plurality of states of multi-level cell (MLC) memory cells in a group of the MLC memory cells. Based on the determined cell voltage distribution, a write verify level for a portion of the plurality of states is adjusted to achieve a desired error probability distribution between states in the group of the MLC memory cells. The trigger event may include completion of a predetermined number of program and erase cycles in the group of the memory cells or detecting a bit error rate or cell error rate greater than a respective predetermined threshold.

If the MLC memory cells are programmed in an interleaved ECC mode, the desired error probability distribution between states may be a minimized cell error rate for the MLC memory cells, and the verify levels may be moved until all overlap areas of CVD between adjacent states are determined to be equal. Alternatively, if the group of the MLC memory cells are programmed in a non-interleaved ECC mode, the desired error probability distribution between states in may be a balanced bit error rate for the MLC memory cells, and the write verify levels may be moved until each overlap area of CVD between adjacent states is a respective predetermined size, where the predetermined size of a first overlap area between a first two adjacent states differs from a predetermined size of a second overlap area between a second two adjacent states.

In one implementation, achieving the minimized cell error rate or balanced bit error rate may be accomplished by sequentially moving verify voltage levels between states in an iterative manner to achieve the even distribution of CVD overlap between states for interleaved ECC mode cells and to achieve the distribution of different CVD overlap between states desired for non-interleaved ECC mode cells.

According to another aspect a memory device includes flash memory having multi-level cell (MLC) flash memory cells and a controller in communication with the flash memory. The controller is configured to determine if a verify level trigger event has occurred and, in response to determining that the verify level trigger event has occurred, determine a cell voltage distribution (CVD) for each the states of MLC memory cells in a group of the MLC memory cells. Based on the determined CVD, the controller may adjust a write verify voltage level for a portion of the states to achieve a desired error probability distribution between states in the group of the MLC memory cells.

BRIEF DESCRIPTION OF THE DRAWINGS

FIG. 7 shows a hypothetical cell voltage distribution (CVD) for a memory system storing two bits per cell (X2).

FIG. 8 shows the hypothetical CVD of the cell of FIG. 7 with a verify voltage level for a state being shifted.

FIG. 10 is a flow diagram of a process of minimizing cell error rate in an MLC flash memory cell encoded in an interleaved error correction code (ECC) mode.

FIG. 11 illustrates a hypothetical CVD in a two bit per cell MLC flash memory cell having equal CVD overlap per state.

FIG. 12 illustrates the hypothetical CVD of FIG. 11 after shifting verify levels to balance bit error rate between pages in the MLC flash memory cell.

BRIEF DESCRIPTION OF THE PRESENTLY PREFERRED EMBODIMENTS

Figure 1:
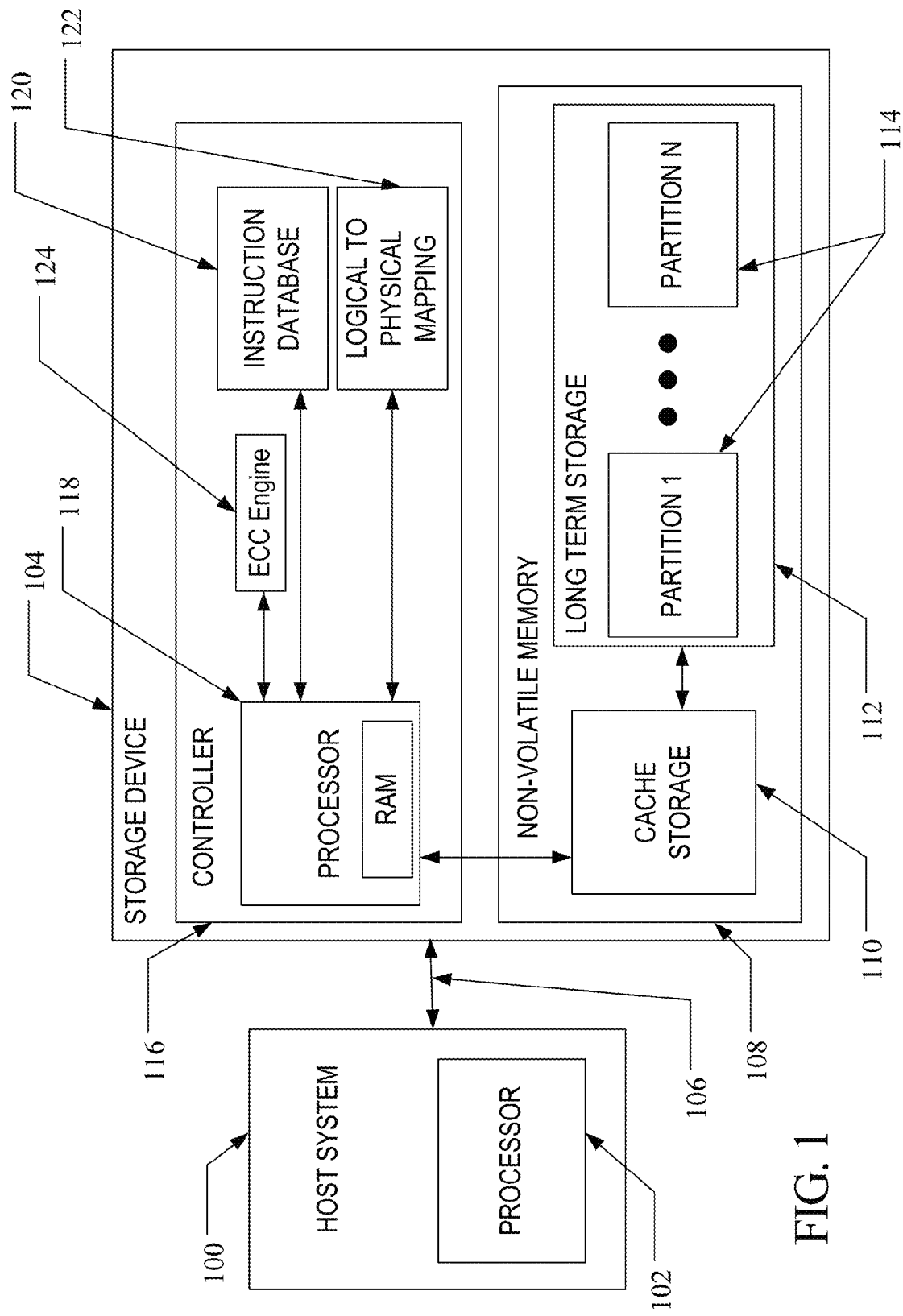
FIG. 1 is a block diagram of a memory system having a long term memory with partitions for different data access needs.

A flash memory system suitable for use in implementing aspects of the invention is shown in FIG. 1. A host system 100 having a processor 102 stores data into, and retrieves data from, a flash storage device 104. The storage device 104 may be a solid state disk (SSD) embedded in the host, flash memory in a mobile phone or may exist in the form of a card or other removable drive that is removably connected to the host 100 through a mechanical and electrical connector. The host 100 may be any of a number of data generating devices, such as a personal computer, portable tablet or computing device, mobile phone or etc. The host 100 communicates with the storage device over a communication channel 106.

The storage device 104 contains non-volatile memory 108 that includes cells that are arranged as a short term storage array (referred to herein as cache storage) 110 and a long term storage array 112. The cache storage 110 and long term storage 112 may be made up of the same type of flash memory cell or different types of flash memory cells. For example, the cache storage 110 may be configured in a single level cell (SLC) type of flash configuration having a one bit per cell capacity while the long term storage 112 may consist of a multi-level cell (MLC) type flash memory configuration having two or more bit per cell capacity to take advantage of the higher write speed of SLC flash and the higher density of MLC flash. Different combinations of flash memory types are also contemplated for the cache storage 110 and long term storage 112.

The MLC flash memory making up the long term storage 112 may be adaptable to handle different types of data. For example, files which are read with low frequency by the user, or files which are stored and read in a sequential order (e.g. music file, photos, movies), may be better stored in an interleaved ECC mode while frequently used files that are read in random order, especially files related to the operating system (of a host such as a PC, cell phone, tablet) and files that are used often by the user (or the host), may be best stored in non-interleaved ECC mode. Similarly, it may be advantageous to manage randomly accessed or stored data using one type of ECC scheme, while managing sequentially stored data using another type of ECC scheme. Accordingly, the storage device may have separate partitions 114 in MLC memory, where a certain type of user data is encoded in an interleaved ECC mode in one partition and other types of user data is encoded in a non-interleaved mode in a separate partition.

The storage device 104 also includes a controller 116 that may include a processor 118, instructions 120 for operating the processor 118 including instructions for carrying out the methods described herein, a logical block to physical block address translation table 122, and an error correction code (ECC) engine 124 for handling error encoding and decoding.

Figure 2:
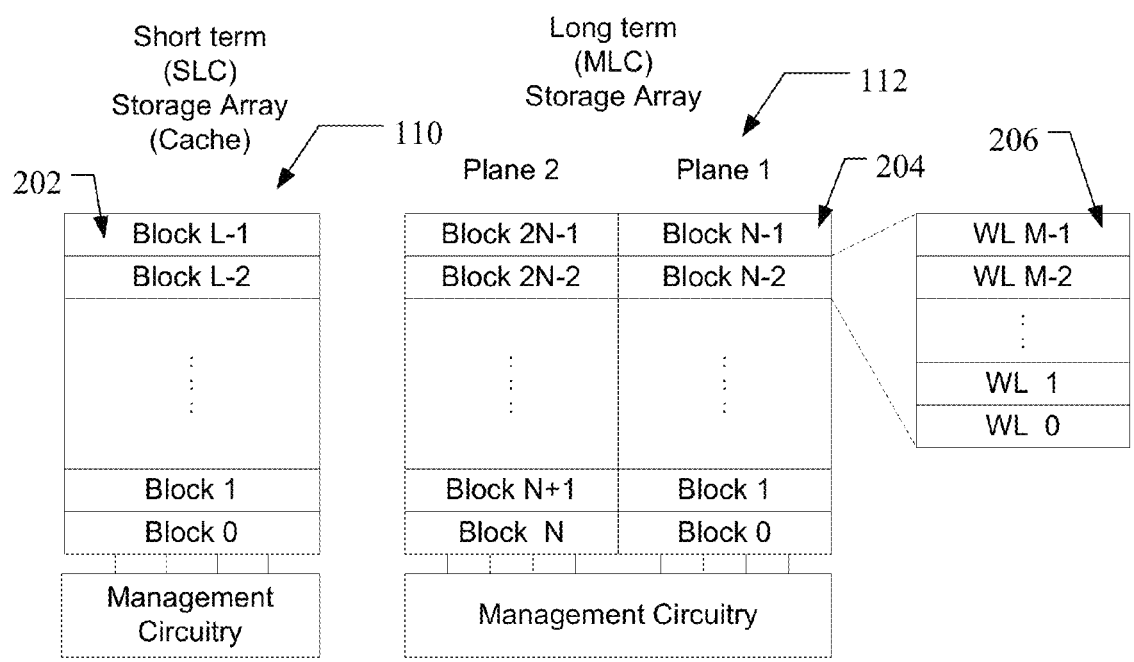
FIG. 2 illustrates an example physical memory organization of the system of FIG. 1.

Referring to FIG. 2, the cache storage 110 is typically implemented as an array of SLC blocks 202, while the long term memory 112 is implemented as an array of MLC blocks 204. Each block is comprised of Word Lines (WL) 206 and a group of cells belonging to same WL 206 is denoted as a physical page. A block of memory cells is the unit of erase, i.e., the smallest number of memory cells that are physically erasable together. For increased parallelism, however, the blocks may be operated in larger metablock units. One block from each plane of memory cells may be logically linked together to form a metablock. In a storage device where the cache storage 110 is in an SLC configuration and the main storage 112 is in an MLC configuration, a metablock arrangement is useful because multiple cache blocks 202 may be needed to store an amount of data equal to one main storage block 204. Each block 202 in the SLC storage is also composed of cells. The number of bits in each cell is different between the SLC and MLC storage areas. The number of logical pages in each WL corresponds to the number of bits stored in each cell. Therefore in one physical page in the SLC storage there is also one logical page while the number of logical pages stored in the MLC storage could be 3 for the case where the MLC storage includes 3 bits in each cell.

Figure 3:
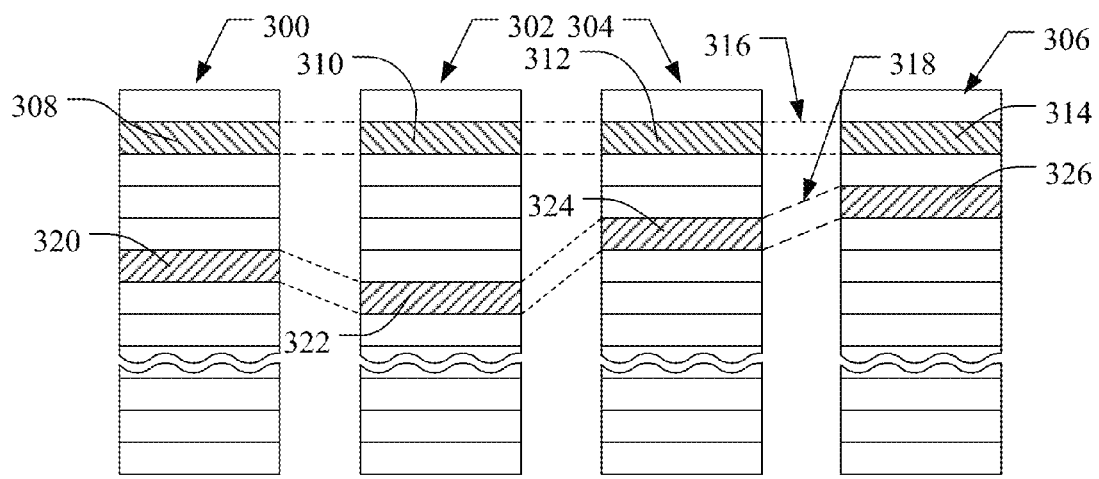
FIG. 3 illustrates an alternative example physical memory organization.

Referring to FIG. 3, a conceptual illustration of a representative flash memory cell array is shown having metapages and metablocks. In the example of FIG. 3, four planes or sub-arrays 300, 302, 304 and 306 memory cells are shown that may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 3 by rectangles, such as blocks 308, 310, 312 and 314, located in respective planes 300, 302, 304 and 306. There may be dozens or hundreds or thousands of blocks in each plane. Blocks may be logically linked together to form a metablock that may be erased as a single unit. For example, blocks 308, 310, 312 and 314 may form a first metablock 316. The blocks used to form a metablock need not be restricted to the same relative locations within their respective planes, as is shown in the second metablock 318 made up of blocks 320, 322, 324 and 326.

Figure 4:
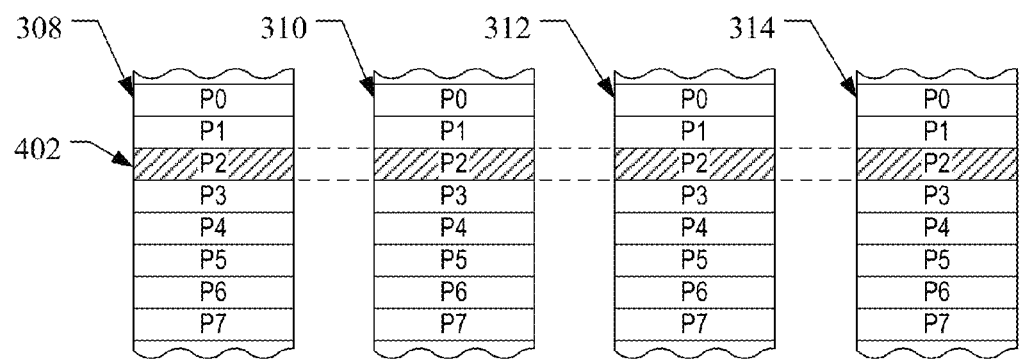
FIG. 4 shows an expanded view of a portion of the physical memory of FIG. 3.

The individual blocks are in turn divided for operational purposes into pages of memory cells, as illustrated in FIG. 4. The memory cells of each of blocks 308, 310, 312 and 314, for example, are each divided into eight pages P0-P7. Alternately, there may be 16, 32 or more pages of memory cells within each block. A page is the unit of data programming and reading within a block, containing the minimum amount of data that are programmed or read at one time. A metapage 402 is illustrated in FIG. 3 as formed of one physical page for each of the four blocks 308, 310, 312 and 314. The metapage 402 includes the page P2 in each of the four blocks but the pages of a metapage need not necessarily have the same offset position within each of the blocks. A metapage is the maximum unit of programming. The blocks disclosed in FIGS. 2-4 are referred to herein as physical blocks because they relate to groups of physical memory cells as discussed above. As used herein, a logical block is a virtual unit of address space. Each logical block typically defines a logical block address (LBA) that is associated with data received from a host 100. The LBAs are then mapped to one or more physical blocks in the storage device 104 where the data is physically stored.

The storage device 104 may use an error correction coding (ECC) scheme when storing data in the non-volatile memory 108 to protect user data. The mapping of ECC code words into the pages of a WL, directly affect the reliability of the data and the efficiency of accessing it (e.g. the programming and reading speed). The word lines of MLC flash memories are considered as being made up of multiple logical pages, where each logical page contains the bits in a certain position. For example, in a 2 bit per cell MLC flash (X2), there will be 2 logical pages: one for the least significant bit (LSB) and one for the most significant bit (MSB). They are also sometimes referred to as lower and upper pages.

An ECC scheme may be applied to data in the non-volatile memory 108 in one of two modes: interleaved or non-interleaved. In an interleaved ECC mode, each ECC code word is programmed across multiple logical pages of a word line (WL). The errors in this mode of operation (interleaved code words) are balanced across all the codewords since each codeword is stored in a mixture of pages, and each two codewords contain the same amount of bits from each page (e.g. upper/lower). In addition, the code words used in the interleaved ECC mode of operation are typically longer than the code words used in a non-interleaved ECC mode. It is known that long error correction codes can provide better error correction capability and a lower error floor, which in turn provide higher reliability and better cycling and data retention specification. On the other hand, using long code words implies slower transfer and decoding times, incurring potentially unacceptable latencies, especially if very small data chunks (e.g. 0.5 KB sectors) are needed. Furthermore in the interleaved case the sensing time is longer than in the non-interleaved case because, in the interleaved case, for each ECC block read all the voltage thresholds need to be read, while in the non-interleaved case only the voltage thresholds corresponding to the required logical page are being sensed.

In a non-interleaved ECC mode, the ECC code words are programmed and read per logical page. This means that each code word is written in a unique logical page. This mode of operation achieves fast read and write times but, as discussed in more detail below, it may suffer from a larger amount of errors where the errors in each logical page have a different probability. This follows from the fact that the different logical pages have different error distributions, and the total error resiliency of the memory device is governed by the least reliable page.

Figure 5:
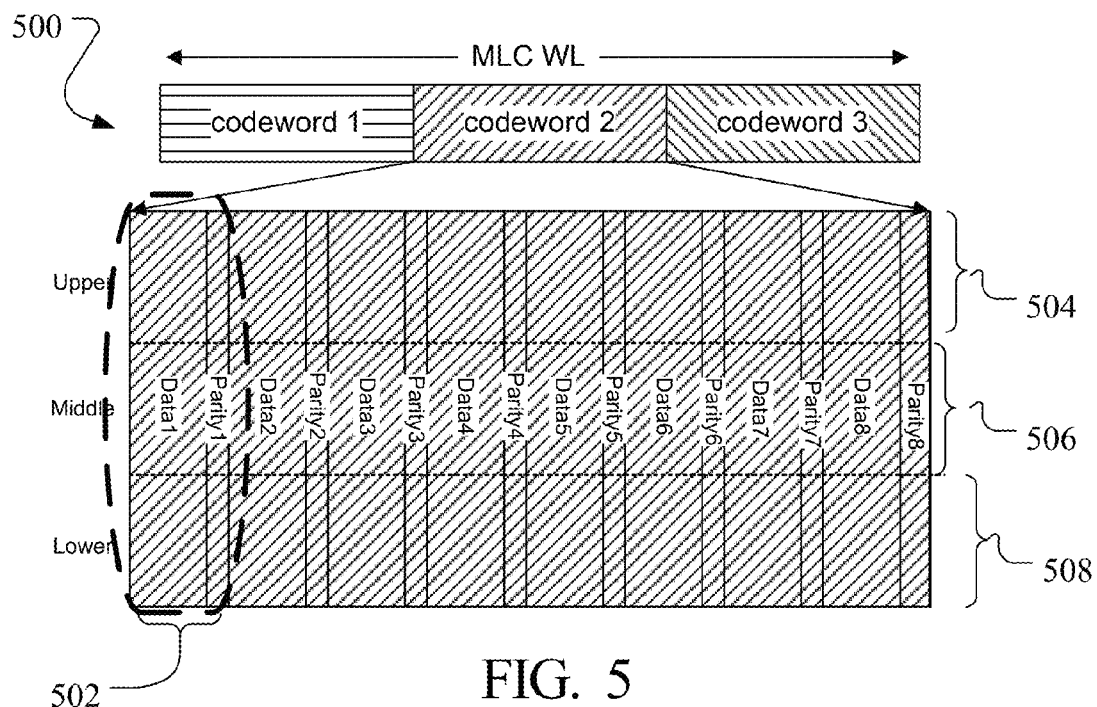
FIG. 5 illustrates a multi-level cell (MLC) wordline where data on upper, middle and lower pages has error correction coding applied in an interleaved manner.

An example of an interleaved ECC scheme in a WL 500 of a 3 bit-per-cell MLC memory is shown in FIG. 5, where each code word (e.g. "codeword 2") is interleaved among all the different pages (upper 504, middle 506 and lower 508) of the WL 500. Typically in the interleaved ECC scheme, each cell of the WL 500 includes information related to one code word 502. The code word may include thousands of bits and may be stored in as many 3 bit-per-cell MLC memory cells as is necessary to accommodate the number of bits in the code word.

Figure 6:
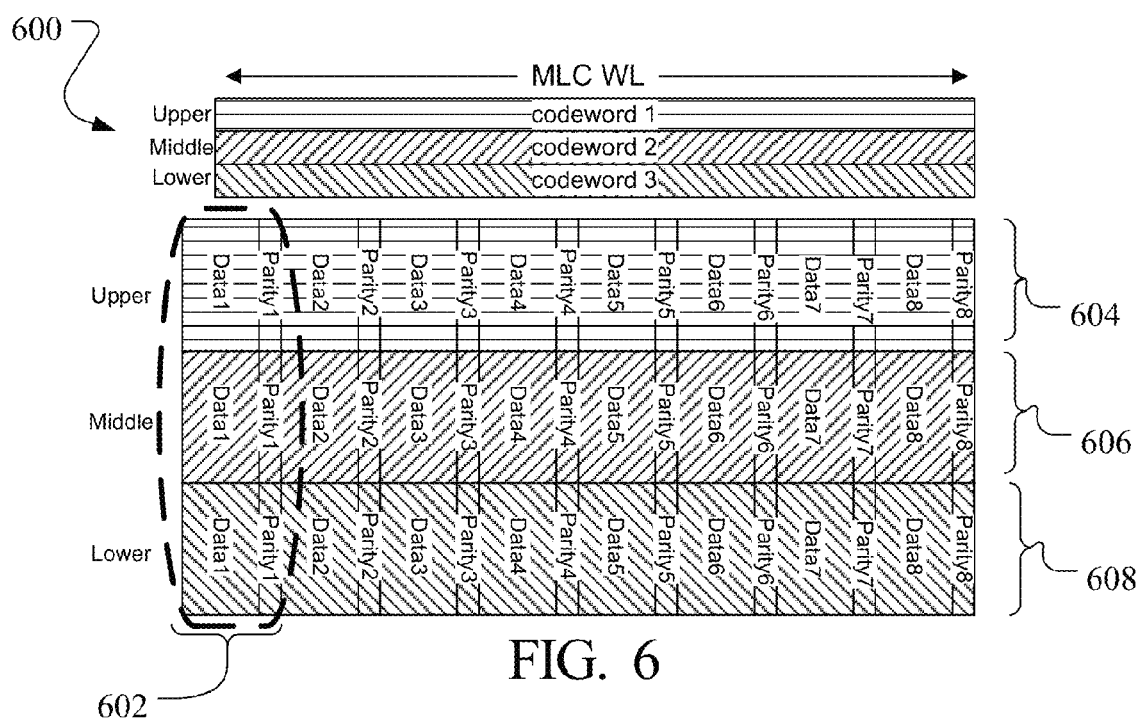
FIG. 6 illustrates a MLC wordline where data on upper, middle and lower pages has error correction coding applied in a non-interleaved manner.

An example of a non-interleaved ECC scheme is shown in FIG. 6, where each code word is only spread across one page (upper 604, middle 606 or lower 608) of each cell of the WL 600. In the non-interleaved example of FIG. 6, each of the 3 bit-per-cell MLC memory cells includes parts of three different code words, such that item 602 represents 3 code words.

FIG. 7 illustrates a hypothetical cell voltage distribution (CVD) 700 for a memory system storing two bits per cell (also referred to as X2 memory). Each state (Er, A, B, C) is shown with a voltage distribution around the expected value of the voltage level 702 for that state. For each state, the expected value of the voltage levels is a function of the verify level of this state. A verify level is a voltage level applied by the controller during a data write process, (also known as programming), to determine which cells have reached a desired threshold voltage (which is a function of the verify voltage level). When a flash memory cell is programmed, it is typically programmed by injecting small amounts of charge at a time until the charge builds up to the desired threshold voltage level. The verify voltage for the desired state is applied after each incremental injection of charge, and cells which are determined to have reached their desired threshold voltage are inhibited from further programming.

The CVD of the cell in FIG. 7 is unbalanced because the overlap region 704 between the erase state (Er) and the next highest state (A) is much larger than the overlap between any other states. Therefore the expected CER originating from an error between these states is much larger than the CER originating from errors between other states, and it seems that this is not the optimal CVD for this system, even if the memory is programmed in an interleaved fashion. Setting the verify level of state A to be slightly higher than it is in FIG. 7 will move the voltage distribution of state A to the right, generating more balanced error regions between all the boundaries of the states. This is depicted in FIG. 8, where the original region for state A 802 is in the background and a new region for state A 804 is generated to the right of the original region. The CER is a function of the total sum of the overlap regions and normalized by the number of states. Thus, if an optimization of the verify levels is done such that the sum of the overlap regions is minimized then the CER is expected to be minimized as well.

In the interleaved ECC mode, where each code word is spread over all pages in a WL, a low cell error rate (CER) is generally correlated with a high mutual information level from an information theory point of view. A cell error is an error on any page of a MLC memory cell. Because the cell error rate relates to any error in a state in a cell, regardless of the page it occurs on or how many pages in the cell are incorrect, it is desirable to reduce read errors evenly among all pages of cells encoded in an interleaved ECC mode. Therefore, when defining the programming parameters which determine the distribution of the states for the interleaved case, it is desirable to compute the optimization of the state verify levels such that the full available voltage window will be used, and the cell error rate at the ECC decoder input is minimal. A low raw CER is in correlation with NAND channel with high mutual information, therefore optimizing the state's verify levels for achieving a low CER is a good choice for optimization also from the information theory point of view.

In the non-interleaved ECC case, different code words may exhibit different bit error rates. One reason for the unequal BER is the different number of transition points (0 to 1 and 1 to 0 of the mapping) in different pages. For example in an X2 memory system, each cell consists of 4 states, therefore there are 3 boundaries between the states. In the non-interleaved programming scheme according to the mapping 902 depicted in the CVD 900 of FIG. 9, the lower page will have a much lower BER than the upper page, since the transitions that cause an error in the Lower page are transitions between states A and B, while the other two transitions affect the Upper page. Therefore code words which are programmed to the Lower page will have much lower BER than code words which are programmed to the Upper page. From the CVD 900 illustrated in FIG. 9 it is evident that the overlap 904 between states A and B is much smaller than the overlap between each of the other states, and therefore the overlap between states A and B is much smaller than the sum of the other overlaps of the other boundaries.

Because the overlap regions represent areas where it is unclear which state is represented by a charge in the cell, this implies that the BER of the Lower page is much lower than the BER of the Upper page. An interleaved scheme using the same mapping will exhibit equal BER on all code words, since any two codewords are programmed to the same mixture of pages (e.g. half of the code word in upper page and half in lower).

In a non-interleaved scheme, two pages are read independently, where the first page has only one transition point (at one of the boundaries) and the second page has 2 transition points (at the other boundaries). Therefore if the states are spread equally, and the overlapping between adjacent states are also spread equally and uniformly the BER of the second page would be twice as large as the BER of the first page. From an information theory point of view this may be acceptable, and an ECC coding scheme may be developed to realize the full capacity by using different ECC code words on different pages, where stronger ECC coding is used for the pages having the higher number of transitions. However, the use of different ECC codes is more difficult and demanding of controller resources and it is desirable to operate with the same code on both upper and lower pages.

As disclosed herein, a method and system for computing programming parameters that will result in a distribution of states (or more specifically a cell voltage distribution (CVD)), that minimizes the CER in the interleaved case, and that would balance the BER between pages in the non-interleaved case, is provided. The BER balancing in the non-interleaved case is done under the assumption that the same coding scheme is being used for all the pages, without having an adverse impact on the total capacity of the memory. The CVD of a flash memory is not constant and may vary in time as a function of Program/Erase (P/E) cycles of the memory and D/R. There typically is a significant variance between the BER of the different pages of a word line and for different P/E cycles it is generally not possible to set verify levels as to accommodate the entire range to do the balancing. Therefore, the disclosed method provides programming parameters that are optimized dynamically, such that the programming of the memory may be done with the optimal parameters at the time of programming.

According to one embodiment of the present invention, the CER for interleaved ECC mode cells may be minimized by adjusting the verify levels for states in MLC cells to obtain equal or substantially equal overlap regions. In one implementation, an iterative "guess+check" approach to balancing the CER for a cell may be used by the controller, and may implement binary search to refine the "guess". Although applicable to MLC memory cells having any numbers of bits per cell, the following example assumes the two bit per cell arrangement of FIGS. 7-9.

Referring to FIG. 10, a process flow 1000 will start with the controller of the storage device monitoring parameters of the memory cells (at 1002) and when those monitored parameters reflect a predetermined trigger event, the controller will begin the adaptive verify level adjustment process (at 1004) for an interleaved ECC mode. The parameters being monitored may be a number of program and erase cycles, the number of bit or cell errors, or any of a number of parameters commonly available to the controller of the storage device. The predetermined trigger event may be a number of program/erase cycles being completed, or a particular level of detected bit or cell error rates. Also, the group of cells being monitored may be at any of a number of levels of granularity. For example, the adaptive verify level adjustment process may be configured for a wordline, a block, an entire die or any of a number of groups of cells that can be tracked.

Once a trigger level is detected the guess and check process starts with the controller selecting a desired overlap of CVD between adjacent states in a cell (at 1006). In one embodiment, the "guess+check" method for adjusting one or more verify levels operates in the following manner: For two adjacent states i,j, let $P_{(i,j)}$ denote the sum of probability of errors of deciding i given that j was programmed and deciding j given that i was programmed, which equals the amount of overlap between these two consecutive states. For a 2 bit per cell MLC cell (see FIG. 7), the i and j pairings of consecutive adjacent states are Er-A; A-B; and B-C. It is assumed that the amount of overlap between non-consecutive states (e.g. Er-B or A-C) is negligible.

The "guess" step of selecting the amount of overlap involves the controller choosing a number 's' representing the amount of overlap that each two consecutive states should hold (at 1008). The controller then virtually shifts the consecutive states, (except for Erase state and the highest state—state C in this example—which are kept constant and defined by the voltage window), in a sequential manner. This is preferably done by adjusting the verify levels associated with the states. First the verify level of state A is shifted until the overlap between Erase and state A equals 's' (at 1010, 1012). Then the verify level of state B is shifted until the overlap between state A and state B equals 's'. This procedure continues (at 1014, 1016) in a sequential manner, and the last verify level to be adjusted is the verify level of the second to highest state. Thus, using the 2 bit-per cell example of FIG. 7, the last verify level to be adjusted would be the verify level for state B, so that the last state (C) will be fixed in the highest voltage allowed in order to keep the same overall voltage window for the cell.

After all the adjustable states, those verify levels between those of the lowest and highest states, have been adjusted, the overlap, denoted below by p, between the last state and the second highest state, compared to the overlap area s to see if p=s (at 1018). If p=s, then the adaptive verify voltage process may declare success, store the new verify voltage levels for each state and exit (at 1024). If p<s, the initial guess for 's' was too high so 's' should be updated to a smaller value. In other words, the fact that the overlap between the two last adjacent states is smaller than 's' indicates that we can move any two adjacent states apart from each other more than it was initially done with selected 's', and by doing that the overlap region between any two states can be reduced (at 1022). If p>s, the guess for 's' was too low so 's' should be updated to a higher value (at 1022). In other words, the fact that the overlap between the two last adjacent states is larger than 's' indicates that we have to move two adjacent states closer to each other than they were moved with the initially selected 's', so that the overlap region between any two states may increase. The process may terminate whenever 'p' equals or is close enough to 's', (i.e. |p−s| is smaller than a predetermined threshold), or whenever the number of iterations of the method exceeds a maximal predefined number of iterations (at 1018, 1020). The allowed discrepancy between p and s, i.e. |p−s|, may be application dependent. In one implementation, an acceptable threshold for any discrepancy may be a small percentage (e.g. 1%-5%) from the target s overlap. In one embodiment the calculated verify voltage levels from the last iteration of selecting s may be stored for use in a next write operation when the maximum number of iterations has been reached without achieving |p−s|< a predetermined threshold. In alternative embodiments, the verify voltage levels may be left as they were prior to the guess and check process if the desired threshold is not met and the predetermined maximum number of iterations have been exhausted.

The iterations for selecting and trying different overlap areas may implement a binary search for the value of 's'. The binary search method may works as follows: Given a range of possible overlaps [S1,S2], each time the controller will check the middle of the range (s=(S1+S2)/2), and then depending on last two cases, update the range to be [S1,s] or [s,S2]. The iteration process may stop when the size of the range is below some predefined threshold.

The movement of the verify levels and computation of the overlap areas between states is preferably done "offline". We assume that moving the verify level of a certain state by a small amount will cause the whole CVD pattern associated with the state to move by the same amount or, generally speaking, an amount that is proportional to the shift. The overlap area may readily be computed according to this assumption, and the whole computation may be done without having to reprogram any part of the flash memory. The assumption is a good approximation as long as the change in the verify level is confined to a known interval. Also, the computation of the new verify levels may be done on blocks (or word lines or eblocks, where an eblock is a portion of a word line containing one ECC codeword) containing user data. The new verify levels may be stored in a table and become operational only after the relevant block (or set of blocks) for which they were calculated is erased and about to be programmed again.

In order to implement the above method, the CVD of each state, also known as the SbS (State by State) CVD, needs to be provided. The CVD for each state may be obtained in any of a number of ways. In situations when the user data in a WL or block (but not in a single cell) is successfully decoded (in the controller) by the ECC decoder, the SbS CVD may be generated by the controller because for each cell the programmed state is known (with high probability), when all pages are successfully decoded, and the read voltage can be measured up to DAC level resolution using the regular sense operations incorporating dynamic read shift. However, in some cases this approach may be slow or consume a large amount of RAM in the controller. Alternatively, the CVD may be generated for known reference data without having to decode the representation of the code words by the ECC decoder.

In one embodiment, a Gaussian model may be used to approximate the CVD of each state. For example the CVD for each state may be extracted from the CVD of the entire voltage window, using any of a number of methods well known to those skilled in the art, to provide Gaussian parameters σ and μ for each state.

By approximating the σ and μ for each state via the modeling of the complete voltage window CVD as a sum of Gaussian distributions, only a small amount of RAM is required in the controller for holding the distributions. Using this Gaussian approximation, the controller may receive the voltage bands mean and standard deviation ($\mu_i$ and $\sigma_i$ for each state) and then directly compute the optimal verify levels that will maximize the mutual information, here given for the MLC X3 case:

$$\max\left\{1/3 \sum_{s\in\{L,M,U\}} I(Y; X_s)\right\},$$

where Y is a random variable representing the voltage level of a cell, $X_L$, $X_M$, $X_U$ are binary random variables representing the stored information in bits in the cell. $X_L$ is lower page bit, $X_M$ is the middle page bit and $X_H$ is the higher page bit. $I(T_1;T_2)$ is the mutual information which is a function of the mutual distributions of the random variables $T_1$, $T_2$ (its parameters). Assuming a Gaussian model with certain parameters (or any probabilistic model for that matter), determines this mutual distribution. Note, that in this typical implementation we change the expectations ($\mu_i$) of the Gaussian distributions of the states. These changes in turn, affect the mutual information term in the equation.

Although this computation may be done on the controller of the storage device, it may be a significant processing load for the storage device. In other embodiments, the computation may be made by the host, or by a dedicated server. Thus, the storage device may transmit the voltage window parameters to a dedicated server/computation engine that would compute the verify levels and transmit them back to the flash device. Here the shift in verify level corresponds to the shift applied on the mean values $\mu_1$.

In another embodiment, an even more simplified version of this scheme would be to use the same σ for all cell states by taking the average over $\sigma_i$, e.g.:

$$\sigma = \frac{1}{M}\sum_{i=1}^{M} \sigma_i,$$

where M is the number of states over the voltage window employed to provide with the average function, in X2 memory device M=4 while in X3 device M=8. It is expected that the variations between the states (except 'Er' state) should be small for the same WL under the same conditions (cycling and baking or read disturb conditions). Therefore, in one embodiment, the erase (Er) state may be treated separately and hence a practical solution that reduces the complexity of the iterative "guess check" method disclosed above would use:

$$\sigma_{Er} = \sigma_1, \sigma = \frac{1}{M-1}\sum_{i=2}^{M} \sigma_i.$$

For non-interleaved MLC memory cells, the same basic method described above for dynamically adjusting verify levels for states in the cells may be used, but with several modifications to address the desire to provide a balanced BER rather than a minimized CER as in the interleaved case. For example, an X2 system applying the equal overlap method would result in an equal overlap between states as depicted in the X2 cell 1100 of FIG. 11. Assuming that each state is normally distributed with variance $\sigma^2$, and that the distance between adjacent states is d, then:

$$BER_{Lower} = 0.5 \cdot Q\left(\frac{d}{2\sigma}\right) = 0.5 \cdot BER_{Upper}$$

Thus, equal overlap between adjacent states leads to unbalanced BER between the upper and lower pages of the cell CVD 1100.

Therefore, instead of defining a target of equal overlap, a set of different overlap targets is defined based on the number of transitions between states for a particular page. Maintaining the previous assumptions regarding normal CVD distributions, and denoting the reference distance between adjacent states by d, (where the distance between states is defined as the distance between their corresponding means), a set of targets for the overlap between the states is defined. The reference distance d is set such that each consecutive pair of states will have the same distance between their means. This property is achieved in X2, by setting d=V/3, where V is the distance between the means of state C and state Er (see FIG. 11). The overlap targets are defined in terms of the average distance d, and an additional parameter s. According to this embodiment, the states A and B will each be shifted by s/2 toward each other, such that the distance between states Er and A will be d+s/2, the distance between states A and B will be d-s, and the distance between states B and C will be d+s/2. This is depicted in the X2 cell CVD 1200 of FIG. 11.

The BERs of the Lower and Upper pages may be expressed as:

$$BER_{Lower}(s) = 1/2 Q\left(\frac{d-s}{2\sigma}\right); \quad BER_{Upper}(s) = Q\left(\frac{d+s/2}{2\sigma}\right)$$

So the target is to find 's' such that: $BER_{Lower}=BER_{Upper}$, or if a function $f(s)$ is defined as:

$$f(s) = 1/2 Q\left(\frac{d-s}{2\sigma}\right) - Q\left(\frac{d+s/2}{2\sigma}\right)$$

the target is to find a root for f(s), where 's' is bounded by 0≤s<d.

Another embodiment according to the present invention may receive the voltage windows mean μ and σ, and directly compute the optimal verify levels that will maximize the mutual information. However in the non-interleaved case, because the worst page dominates the error behavior the optimization problem would be a min max problem: max min $\{I_1/I_2\}$, where $I_1$ and $I_2$ are the mutual information of the two pages (in the X2 case). As noted above, this computation may be 'heavy' for a flash memory system, and may instead be outsourced by the controller to be computed by the host, or by a dedicated server.

Figure 14:
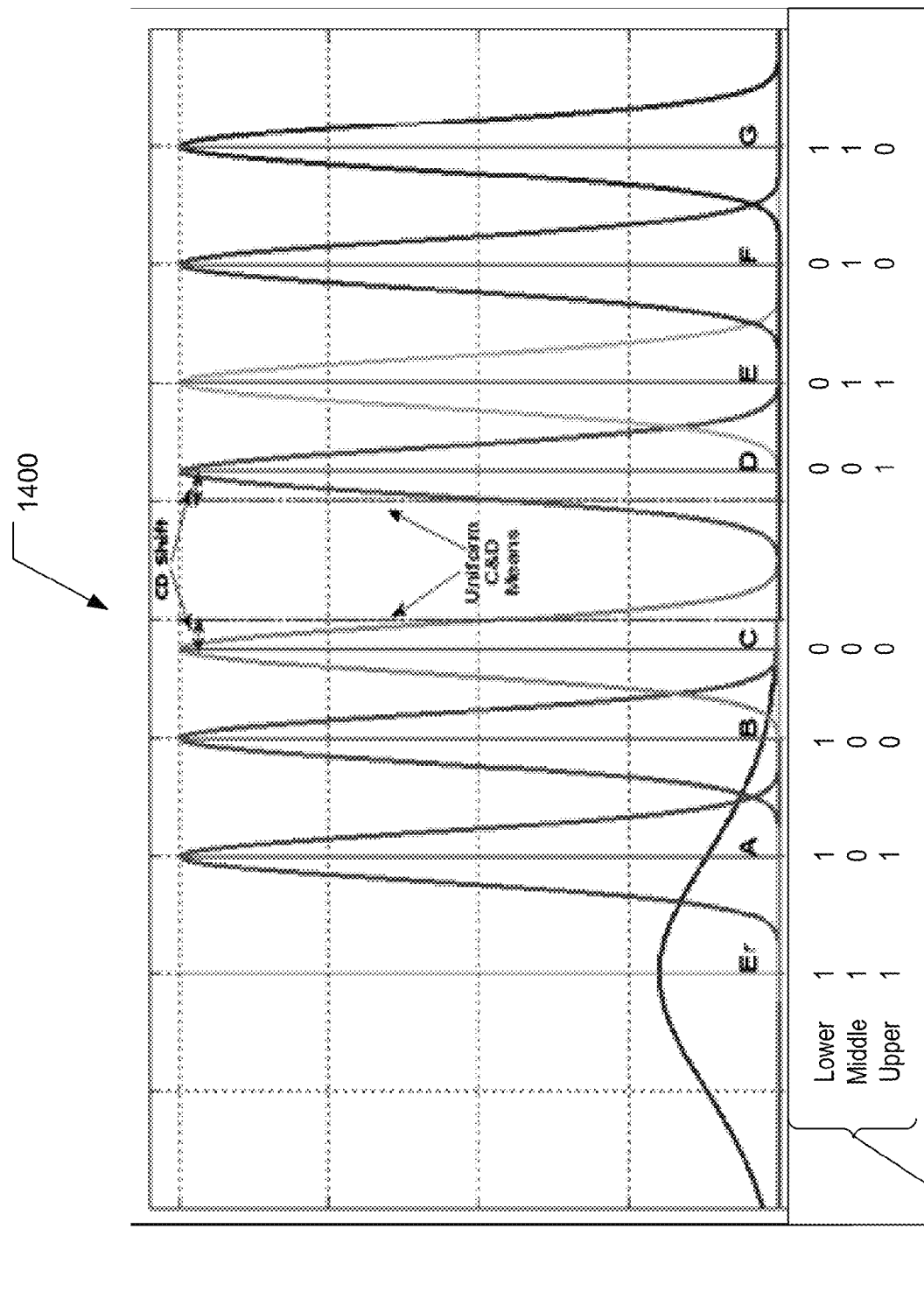
FIG. 14 illustrates a hypothetical CVD and mapping of state transitions per page in a three bit per cell MLC flash memory cell.

A similar method may be applied to a three bit per cell MLC memory cell, also referred to as an X3 cell, such as illustrated in FIG. 14, where the mapping of states to upper, lower and middle pages is illustrated. The equations and targets for this system are summarized in the following equations: For this mapping the number of transitions between consecutive states is 2 for the lower page (B-C, F-G), 2 for the middle page (Er-A,D-E) and 3 for the upper page (A-B, C-D and E-F). Similar to the X2 case, the reference distance d is set such that each consecutive pair of states will have the same distance between their means. This property is achieved in X3, by setting d=V/7, where V is the distance between the means of state G and state Er (see FIG. 11). Let the modified distance between the means of the states be: d for Er-A, A-B, E-F and F-G; d+s for C-D; and d−s/2 for B-C and D-E. Thereby, we have $$BER_{Lower}(s) = \frac{1}{4}Q\underbrace{\left(\frac{d-s/2}{2\sigma}\right)}_{B\leftrightarrow C} + \frac{1}{4}Q\underbrace{\left(\frac{d}{2\sigma}\right)}_{F\leftrightarrow G}$$

$$BER_{Middle}(s) = \frac{1}{4}Q\underbrace{\left(\frac{d-s/2}{2\sigma}\right)}_{D\leftrightarrow E} + \frac{1}{4}Q\underbrace{\left(\frac{d}{2\sigma}\right)}_{Er\leftrightarrow A}$$

$$BER_{Upper}(s) = \frac{1}{2}Q\underbrace{\left(\frac{d}{2\sigma}\right)}_{A\leftrightarrow B;E\leftrightarrow F} + \frac{1}{4}Q\underbrace{\left(\frac{d+s}{2\sigma}\right)}_{C\leftrightarrow D}$$

Note that $BER_{Middle}(s)=BER_{Lower}(s)$, so it suffices to require that $BER_{Lower}(s)=BER_{Upper}(s)$ in order to achieve $BER_{Middle}(s)=BER_{Lower}=BER_{upper}(s)$. The target function $f(s)$ in this case is the function:

$$f(s) = \frac{1}{4}Q\left(\frac{d-s/2}{2\sigma}\right) - \frac{1}{4}Q\left(\frac{d}{2\sigma}\right) - \frac{1}{4}Q\left(\frac{d+s}{2\sigma}\right)$$

It should be noted that in this case a positive 's' parameter indicates the shift of C state in an opposite direction to D state. This is in contradiction to the X2 case. Also as in the previous case 's' is bounded to the region [0,d].

Generalization of the Balancing Method

The equal overlap algorithm discussed above with respect to the interleaved ECC mode data may be modified to support balanced BER between pages for any mapping scheme of a flash memory. Preferably, the method for handling non-interleaved ECC mode data to achieve a balanced BER would operate in the following way: The storage device controller monitors the one or more cell parameters used to determine a verify level trigger (at 1302) and, when a trigger event occurs (at 1304), the controller determines the target overlap for each pair of adjacent states a target overlap, where the target overlap is not the same for all pairs of adjacent states and depends on the number of bits per cell (at 1306).

As noted previously, the process for adjusting verify voltage levels in a cell begins periodically based on one or more certain trigger events. For example, after a predefined number of write and erase (W/E) cycles (100 for example) the backend (controller) may trigger a background task that reads all cells in the group of cells (which may be blocks, WLs or any other granularity group of cells) to determine the CVD for the group of cells. In one alternative, the CVD computed for the group of cells may be assumed to apply to a larger set of cells in the system. Alternatively, or in combination, the trigger may also be invoked when a WL is observed with BER/CER above some predefined threshold after read threshold voltages were already optimized to the relevant read voltage shifts.

In this embodiment, the target overlap between the states is defined as a product of a predefined number and an atomic overlap denoted as S, where S has units of area or probability, and is different from the one dimensional s defined above. For example, in the X2 system (two bits per cell=four states per cell) there is one sense location on the lower page where there is a state transition from 1 to 0 (between states A and B, as shown in FIG. 9) and two sense locations in the upper page between states Er and A and between states B and C, as seen in FIG. 9, where there is a 1-0 and 0-1 transition, respectively.

The probability for a bit error on each page is $BER_{Lower}=p_{AB}$, $BER_{Upper}=p_{EA}+p_{BC}$, and, given an atomic overlap guess of S, we require that: $p_{AB}=2S$; $p_{EA}=p_{BC}=S$ so that the total area of overlap on each page is equal and the BER balanced. Although the desired overlaps between states are not all equal, the different overlaps are distributed so that the sum of the overlaps (and therefore the probability of an error) on a given page in the X2 cell are equal. The analysis for an X3 system (3 bits per cell=8 states per cell) is accomplished in the same manner with the mapping 1402 of state transitions in the X3 CVD 1400 shown in FIG. 14. Accordingly, in the X3 example of FIG. 14 above, we note that the different overlaps required, due to the different bit error probabilities (based on the different numbers of transitions) per page, should be distributed among the states as follows: $p_{BC}=p_{FG}=p_{EA}=p_{DE}=1.5S$; $p_{AB}=p_{CD}=p_{EF}=S$. A similar analysis technique to determine an atomic overlap and multiplier would apply to flash memory cells having greater than 3 bit per cell arrangements.

Figure 9:
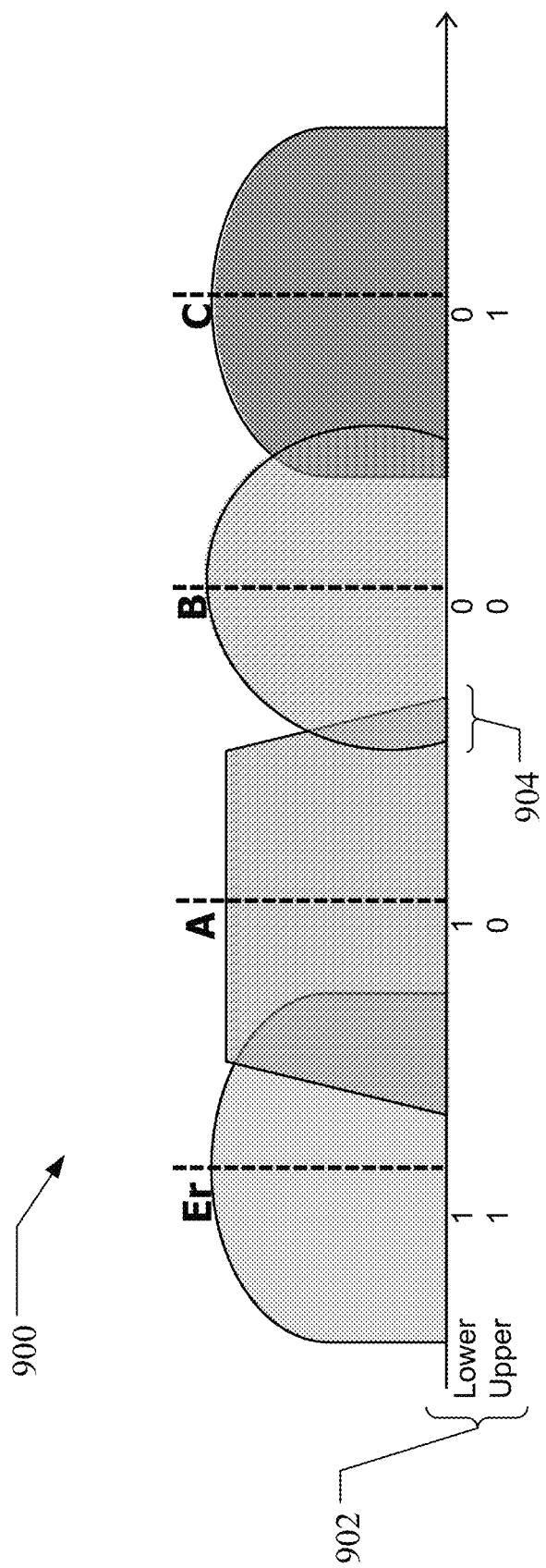
FIG. 9 shows a mapping of state transitions per page in a two bit per cell MLC flash memory cell.
Figure 13:
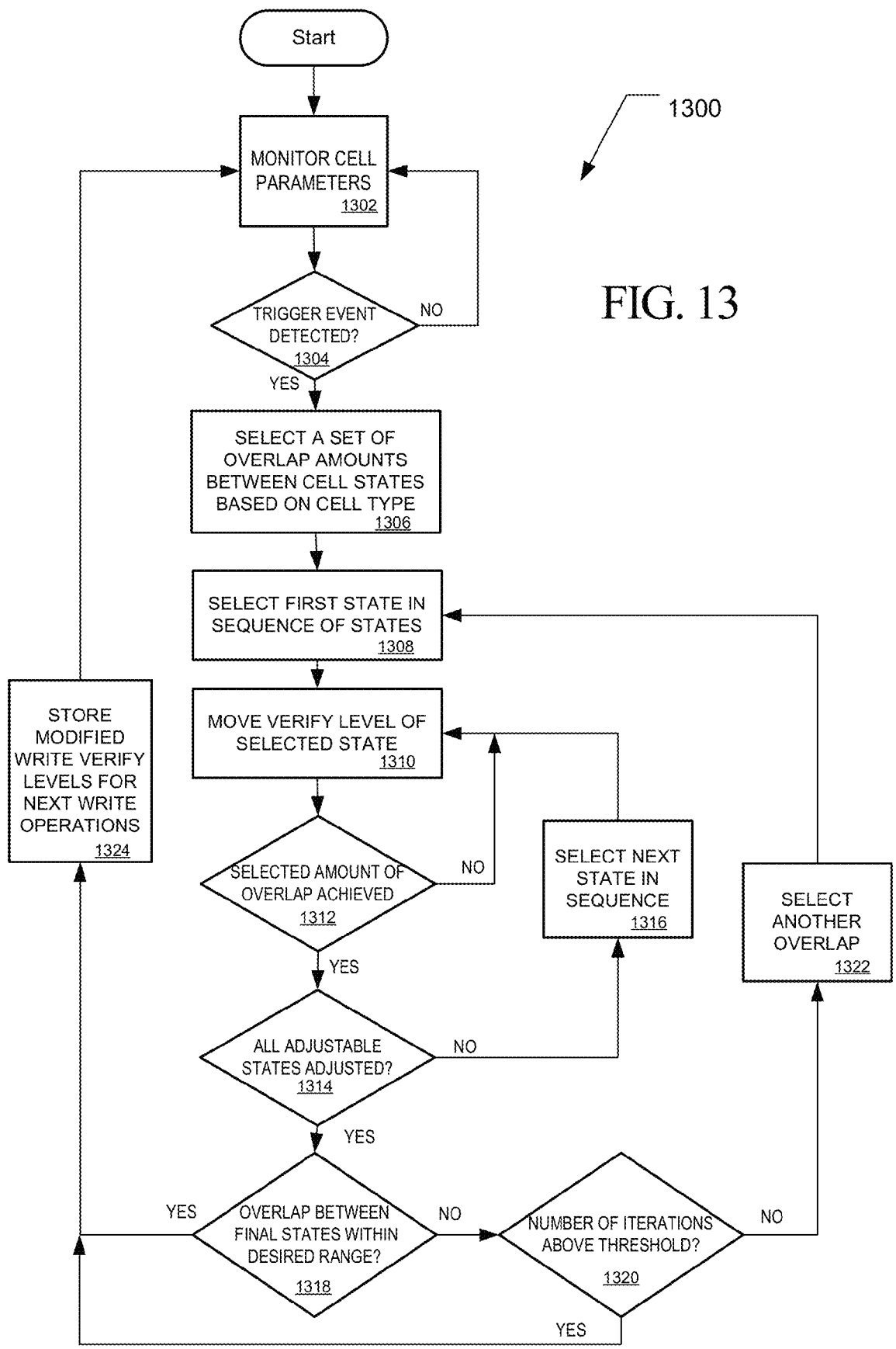
FIG. 13 is a flow diagram of a process of balancing bit error rates between pages of a MLC flash memory cell encoded in a non-interleaved ECC mode according to a preferred embodiment.

Referring again to FIG. 13, the process of balancing BER between pages in a non-interleaved ECC mode cell continues in much the same manner as the interleaved ECC mode process of FIG. 9. For each WL and each block, a binary (or "lion in the desert") search is performed to find the optimal shifts in the verify levels according to above mentioned "guess and check" procedure of FIG. 9 but employing the atomic probability plus some multiplicative overlap region dependent correction factor (denoted above as 1.5 for $P_{BC}$ in the X3 cells for example) rather than targeting a uniform overlap region between states as in the case of cells programmed in an interleaved ECC mode.

Once the guessed atomic overlap amount and any multiplier are identified for the particular state transition (at 1308), the verify voltage level for the state at the higher end of the overlap is moved to achieve the desired overlap (at 1310, 1312) and this is repeated sequentially for each other state that can be moved (i.e. all states except the lowest and highest voltage states so that the full voltage window may be maintained for the cell) (at 1314, 1316). When the last moveable verify voltage level has been shifted according to the guessed atomic overlap (and any multiplier specific to the state), the overlap between the second to last state and the highest voltage state is measured and compared the atomic overlap amount, and any calculated multiplier for the overlap between the last two states, to see if the remaining overlap after shifting all the prior state verify levels falls within a predetermined range of the targeted overlap. If the overlap falls outside the target and threshold range of variation, and the predetermined threshold number of iterations of the guess and check process have not been exceeded, then the next atomic overlap is guessed (e.g. using a binary search algorithm as discussed previously) and the process repeated (at 1318, 1320, 1322). Alternatively, if the measured overlap is within the desired range or the threshold number of iterations of guessing the overlap has been exceeded, then the modified verify voltage levels are stored and the controller monitors the cell parameters for a next trigger event (at 1324).

The verify voltage shifts may be placed in the first page of the first WL of each MLC block or may be stored in RAM using a tagging mechanism and flushed/recovered from NAND at power down/up. The "next time verify shifts" resulting from the guess and check process may be stored in an SLC management block once the computation above has completed. Upon the next programming of blocks in the selected group of MLC cells subject to the adaptive verify process(es) described above, the values from the SLC management block are used. During the programming of the selected group of MLC cells these values may also be programmed in the first page of the first WL of the block. In one embodiment, if the SLC management block does not have an updated verify voltage value for a state then immediately before programming the last set is taken from the first page of first MLC WL.

Embodiments disclosed above include novel methods of BER and CER management via adaptive adjusting of the verify levels of the programmed states. The adaptation, or dynamic aspect, may be due to cycling, baking (for example, an elapsed time) and space (for example, different adjustment for different WLs, blocks, planes, dies based on location and the different effects experienced at the different locations).

A system and method have been disclosed for minimizing CER for MLC memory cells programmed in an interleaved mode and for balancing BER for MLC cells programmed in a non-interleaved ECC mode. For simplicity in implementation and reduced ECC overhead for a memory system controller, the system and method assumes and optimizes for a same ECC code word being used for each page in a cell in one embodiment. The memory system may have multiple partitions in the MLC memory, some for non-interleaved ECC encoded data and some for interleaved ECC encoded data. For interleaved ECC mode data, the method may calculate an even overlap area to be applied between all the states of the cell and move, in an iterative process, the verify voltages for each state to achieve the desired equal overlap between the states of the cell. For non-interleaved data, the method may include determining a total number of state changes per page and applying overlaps to each state change in a page that are unequal, but where the sum of the overlaps for state changes in each page are equal, so that the BER is balanced. The applied overlaps and verify voltage shifting for the non-interleaved case may be accomplished in the same iterative process as for the interleaved case except that the predetermined different overlaps are targeted rather than a same overlap for all states.

As part of calculating the overlap between each of the states in an MLC memory, the state by state cell voltage distribution (CVD) may be estimated by the controller using an assumption on the statistical model of the CVD. A typical example for such an assumption is the aforementioned Gaussian model. The calculation of the overlaps can be done either by the controller or exported for calculation to the host or other processing source via the host, to determine the amount of movement of each state's verify level to achieve the desired overlap. The adaptive verify level adjustment may be repeated dynamically based on a monitored state of the memory device, or a portion of the flash memory cells in the memory device, and any calculated verify level shift may be stored in SLC, MLC or RAM memory for use in each next data write process until a next trigger event leads to a further execution of the adaptive verify level setting method.

In summary, the above embodiments can be used to provide a simplified way to dynamically adjust verify levels for all, or select groupings, of MLC memory cells in a memory device. The disclosed embodiments may increase the read performance of a non-interleaved flash memory by reduction in the decoding procedure via minimizing the (balanced) BER. The disclosed embodiments may also extend the life time of the NAND flash as they allow more cycles for the NAND flash while maintaining the same level of reliability.

It is intended that the foregoing detailed description be understood as an illustration of selected forms that the invention can take and not as a definition of the invention. It is only the following claims, including all equivalents that are intended to define the scope of this invention. Also, some of the following claims may state that a component is operative to perform a certain function or configured for a certain task. It should be noted that these are not restrictive limitations. It should also be noted that the acts recited in the claims can be performed in any order—not necessarily in the order in which they are recited.

We claim:

1. A method for adaptively setting write verify levels in a memory, the method comprising:
    in a controller of the memory, the controller:
        in response to detecting a verify level trigger event, determining a cell voltage distribution (CVD) for each of a plurality of states of multi-level cell (MLC) memory cells in a group of the MLC memory cells in the memory;
        based on the determined CVD, adjusting a write verify level for a portion of the plurality of states, wherein the portion of the plurality of states comprises all of the plurality of states except for a lowest voltage state and a highest voltage state in the group of the MLC memory cells; and
        wherein adjusting the write verify level for the portion of the plurality of states comprises:
            sequentially moving the verify level of each of the portion of the plurality of states to achieve a target CVD overlap area, respectively, between each adjacent state;
            wherein when the group of the MLC memory cells comprises MLC memory cells programmed in an interleaved ECC mode, the target CVD overlap area comprises an equal CVD overlap area between each adjacent state; and
            wherein when the group of the MLC memory cells comprises MLC memory cells programmed in a non-interleaved ECC mode, the target CVD overlap area between a first two adjacent states differs from a predetermined size of a second CVD overlap area between a second two adjacent states.

2. The method of claim 1, wherein the verify level trigger event comprises completion of a predetermined number of program and erase cycles in the group of the memory cells in the memory device.

3. The method of claim 1, wherein the verify level trigger event comprises detecting a bit error rate or cell error rate greater than a respective predetermined threshold.

4. The method of claim 1, further comprising:
    saving each adjusted write verify level when a final overlap area between the highest voltage state and a state adjacent to the highest voltage state is within a predetermined range of the target CVD overlap area.

5. The method of claim 4, further comprising, when after sequentially moving the verify level of each of the portion of the plurality of states to achieve the target CVD overlap area, the final overlap area is outside the predetermined range of the target CVD overlap area, repeatedly determining a new target overlap area and then sequentially moving the verify level of each of the portion of the plurality of states to achieve the new target overlap between respective states until the final overlap area is within the predetermined range of the new target overlap area.

6. The method of claim 1, wherein, for MLC memory cells programmed in the non-interleaved ECC mode, adjusting the write verify level for the portion comprises:
    determining the target CVD overlap area between each adjacent state of MLC memory cells in the group of the MLC memory cells based on a base overlap area and a multiplier based on a MLC cell type and a page mapping of the group of the MLC memory cells.

7. A memory device comprising:
    a non-volatile memory having multi-level cell (MLC) memory cells; and
    a controller in communication with the non-volatile memory, wherein the controller is configured to:
        in response to detection of a verify level trigger event determine a cell voltage distribution (CVD) for each of a plurality of states of multi-level cell (MLC) memory cells in a group of the MLC memory cells;
        based on the determined CVD, adjust a write verify level for a portion of the plurality of states to achieve a desired error probability distribution between all states in the group of the MLC memory cells of the non-volatile memory device, wherein the portion of the plurality of states comprises all of the plurality of states except for a lowest voltage state and a highest voltage state in the group of the MLC memory cells;
        wherein to adjust the write verify level for the portion of the plurality of states, the controller is further configured to:
            sequentially move the verify level of each of the portion of the plurality of states to achieve a target CVD overlap area, respectively, between each adjacent state;
            wherein, when the group of the MLC memory cells comprises MLC memory cells programmed in an interleaved ECC mode, the target CVD overlap area comprises an equal CVD overlap area between each adjacent state; and
            wherein when the group of the MLC memory cells comprises MLC memory cells programmed in a non-interleaved ECC mode, the target CVD overlap area between a first two adjacent states differs from a predetermined size of a second CVD overlap area between a second two adjacent states.

8. The memory device of claim 7, wherein the verify level trigger event comprises completion of a predetermined number of program and erase cycles in the group of the memory cells in the memory device.

9. The memory device of claim 7, wherein the verify level trigger event comprises detection of a bit error rate or cell error rate greater than a respective predetermined threshold.

10. The memory device of claim 7, wherein the controller is further configured to:
    save each adjusted write verify level when a final CVD overlap area between the highest voltage state and a state adjacent to the highest voltage state is within a predetermined range of the target CVD overlap area.

11. The memory device of claim 10, wherein the controller is further configured to, when after sequentially moving the verify level of each of the portion of the plurality of states to achieve the target CVD overlap area, the final overlap area is outside the predetermined range of the target CVD overlap area, repeatedly determine a new target overlap area and then sequentially move the verify level of each of the portion of the plurality of states to achieve the new target overlap between respective states until the final overlap area is within the predetermined range of the new target overlap area.

12. The memory device of claim 7, wherein, for MLC memory cells programmed in the non-interleaved ECC mode, to adjust the write verify level for the portion the controller is configured to:
   determine the target CVD overlap area between each adjacent state of MLC memory cells in the group of the MLC memory cells based on a base overlap area and a multiplier based on a MLC cell type and a page mapping of the group of the MLC memory cells.

13. The memory device of claim 7, wherein to adjust the write verify levels when the group of MLC memory cells comprises MLC memory cells programmed in the interleaved ECC mode, the controller is configured to:
   sequentially move a respective write verify level for each of the portion of the plurality of states, from lower voltage state to higher voltage, based on a target CVD overlap area;
   after moving the respective write verify level for each of the portion of the plurality of states, compare a final CVD overlap area of the highest voltage state and a second highest voltage state with a next CVD overlap area between the second highest voltage state and a next lower voltage state;
   save the adjusted verify levels when the final CVD overlap area and the next CVD overlap area are within a predetermined range of each other; and
   select a new target CVD overlap area and repeat a process of sequentially moving respective write verify level for each of the portion of the plurality of states when the final CVD overlap area and the next CVD overlap area are outside a predetermined range of each other.

* * * * *